(12) United States Patent
Muniraju et al.

(10) Patent No.: US 11,646,680 B2
(45) Date of Patent: May 9, 2023

(54) AUTONOMOUS WIRELESS MULTIVARIANT SENSOR NODE—AWSN

(71) Applicant: Honeywell International Inc., Charlotte, NC (US)

(72) Inventors: Raghavendra Muniraju, Karnataka (IN); Joseph J. Pane, North Wales, PA (US); Balasubramanya Raju B K, Karnataka (IN); Bin Sai, The Hague (NL); Manu Shastry C R, Bengaluru (IN)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 0 days.

(21) Appl. No.: 17/447,082

(22) Filed: Sep. 8, 2021

(65) Prior Publication Data
US 2023/0074890 A1    Mar. 9, 2023

(51) Int. Cl.
*H02N 15/00*        (2006.01)
*H02N 11/00*        (2006.01)

(52) U.S. Cl.
CPC ........... *H02N 15/00* (2013.01); *H02N 11/002* (2013.01)

(58) Field of Classification Search
CPC ............................ H02N 15/00; H02N 11/002
See application file for complete search history.

(56) References Cited

U.S. PATENT DOCUMENTS

| 9,888,337 | B1 | 2/2018 | Zalewski et al. |
| 2017/0147021 | A1 | 5/2017 | Wu |
| 2020/0019226 | A1 | 1/2020 | Ziv et al. |

FOREIGN PATENT DOCUMENTS

| EP | 0404147 A1 | * 12/1990 |
| EP | 3454607 A1 | 3/2019 |

OTHER PUBLICATIONS

Dekimpe, et al., "A Battery-less BLE IoT Motion Detector Supplied by 2.45-GHz Wireless Power Transfer", 28th International Symposium on Power and Timing Modeling, Optimization and Simulation (PATMOS 2018) pp. 68-75 (7 pages total).
Kozalakis, et al., "A 73.5 uW Indoor-Outdoor Light Harvesting System with Global Maximum Power Point Tracking Edge Machine Learning for AI-Enabled IoT Devices: A Review", J. Low Power Electron. Appl. 2021, 11, pp. 1-10 (10 pages total).
Merenda, et al. "Edge Machine Learning for AI-Enabled IoT Devices: A Review", Sensors 2020, 20, 2533; pp. 1-34 (34 pages total).
Estrada-López, et al., "Multiple Input Energy Harvesting Systems for Autonomous IoT End-Nodes", J. Low Power Electron. Appl. 2018, 8, 6, pp. 1-14 (14 pages total).

* cited by examiner

*Primary Examiner* — Mohamad A Musleh
(74) *Attorney, Agent, or Firm* — John Maldjian; Stevens & Lee PC

(57) ABSTRACT

A system includes a first levitation magnet. The system also includes a suspension magnet configured underneath the first levitation magnet. The suspension magnet oscillates continuously. Magnetic flux cuts across electrical coil windings. Energy is generated as a result of the magnetic flux that cuts across the electrical coil windings. A second levitation magnet is positioned underneath the suspension magnet and first levitation magnet. The suspension magnet is configured to levitate between the first levitation magnet and the second levitation magnet.

20 Claims, 16 Drawing Sheets

AUTONOMOUS WIRELESS MULTIVARIANT SENSOR NODE—AWSN

TECHNICAL FIELD

The present disclosure generally relates to autonomous wireless multivariant sensor nodes (AWSN's) capable of self-generating energy and enhancing energy savings.

BACKGROUND

Many IOT devices are powered by one or more batteries. As such, battery maintenance and replacement can be very cost prohibitive. In many instances, high manpower can be required in order to maintain and or replace a battery in IOT devices and systems.

Most IOT devices are also single sensor or have only a few sensors that are capable of gathering data parameters. As such, there is a possibility of missing out on signatures and other parameters where anomalies could exist. As such, misinformed diagnosis can occur leading to unplanned maintenance and catastrophic failures.

Most IOT devices just sense data and detect anomalies when they occur. Alternatively, the data acquired will be transferred to a personal computer or server where an operator would look and analyze the data and predict the time for maintenance. An operator will still have to closely monitor the data. With large scale industry and plant setups, the manpower to maintain thousands of IOT sensor edge nodes will be an immensely demanding operation.

As such, a need exists for an IOT device to be able to generate its own energy efficiently. In addition, a need exits for the IOT device to be able to sense multiple data parameters and perform its own data inferencing.

SUMMARY

The following summary is provided to facilitate an understanding of some of the features of the disclosed embodiments and is not intended to be a full description. A full appreciation of the various aspects of the embodiments disclosed herein can be gained by taking the specification, claims, drawings, and abstract as a whole.

It is aspect of the disclosed embodiments to provide one or more AWSN's to self-generate energy.

It is another aspect of the disclosed embodiments to provide at least one AWSN that harvests the generated energy to provide the generated energy to modules configured within the at least one AWSN.

The aforementioned aspects and other objectives can now be achieved as described herein.

In an embodiment, a first levitation magnet is configured. A suspension magnet is configured underneath the first levitation magnet. The suspension magnet is configured to oscillate continuously with a specific displacement in relation to acceleration levels and frequency of vibration. Magnetic flux is configured to cut across electrical coil windings positioned above or below the suspension magnet. The energy is generated as a result of the magnetic flux that cuts across the electrical coil windings for powering one or more modules. A second levitation magnet is positioned underneath the suspension magnet and first levitation magnet. The suspension magnet is configured to levitate between the first levitation magnet and the second levitation magnet.

In an embodiment of the system, one or more relief air vents are positioned to minimize friction form the suspension magnet while the suspension magnet is oscillating.

In an embodiment, a method includes positioning a cold plate at a first position. The method also includes configuring heat to flow through a mounting metal bracket to a hot plate and then to the cold plate and a heat sink to enable a thermal gradient to be established. A module transducer converts the established thermal gradient to electrical energy. The method also includes positioning at least one module at a second position to receive the generated energy.

The method includes positioning the hot plate directly underneath a thermo-electric generator.

In an embodiment, a method includes configuring a piezo-electric beam in a direction of a roller beam support assembly. The method also includes positioning a first roller above the roller beam support assembly and a second roller below the roller beam support assembly, wherein the first roller and the second roller are moved toward the piezo-electric beam to increase a frequency of vibration and to optimize an energy generation. The method also includes configuring a roller hinge with a rack and pinion gear arrangement to move the first roller and the second roller back and forth.

In an embodiment, a method includes storage module energy state computation within a thermo-electric, piezo-electric, or electro-magnetic system with generated energy. The method also includes loading sub-modules' power profile management based on the storage module energy state computation, energy function parameters, and duty cycle time-period optimization. The method also includes providing a forecasting function. The forecasting function is based on the energy state computation and power profile management. The forecasting function includes loading sub-module's storage energy consumption behavior prediction and consumption behavior characterization. The method also includes a loading subsystem activation decision and subsystem power requirement profile based on the forecasting function.

The method also includes loading subsystem fault identification that correlates with an energy consumption profile.

In an embodiment, a system includes at least one of a suspension magnet, levitation magnet, spring, thermal gradient, cold plate, hot plate, piezo-electric beam, or roller beam support assembly configured to generate energy using electro-magnetic energy harvesting, thermo-electric energy harvesting, or piezo-electric energy harvesting. The system also includes one or more modules to receive the generated energy. The system further includes one or more sub-modules that provide a forecasting function based on the received generated energy. The forecasting function is based on energy state computation and power profile management. The forecasting function includes loading sub-module's storage energy consumption behavior prediction and consumption behavior characterization. The system also includes one or more sensors that enable a subsystem activation decision and subsystem power requirement profile based on the forecasting function.

In an embodiment of the system, the energy state computation and power profile management is determined based on the generated energy.

BRIEF DESCRIPTION OF THE FIGURES

The accompanying figures, in which like reference numerals refer to identical or functionally similar elements throughout the separate views and which are incorporated in and form a part of the specification, further illustrate the present invention and, together with the detailed description of the invention, serve to explain the principles of the present invention.

Figure 1A:
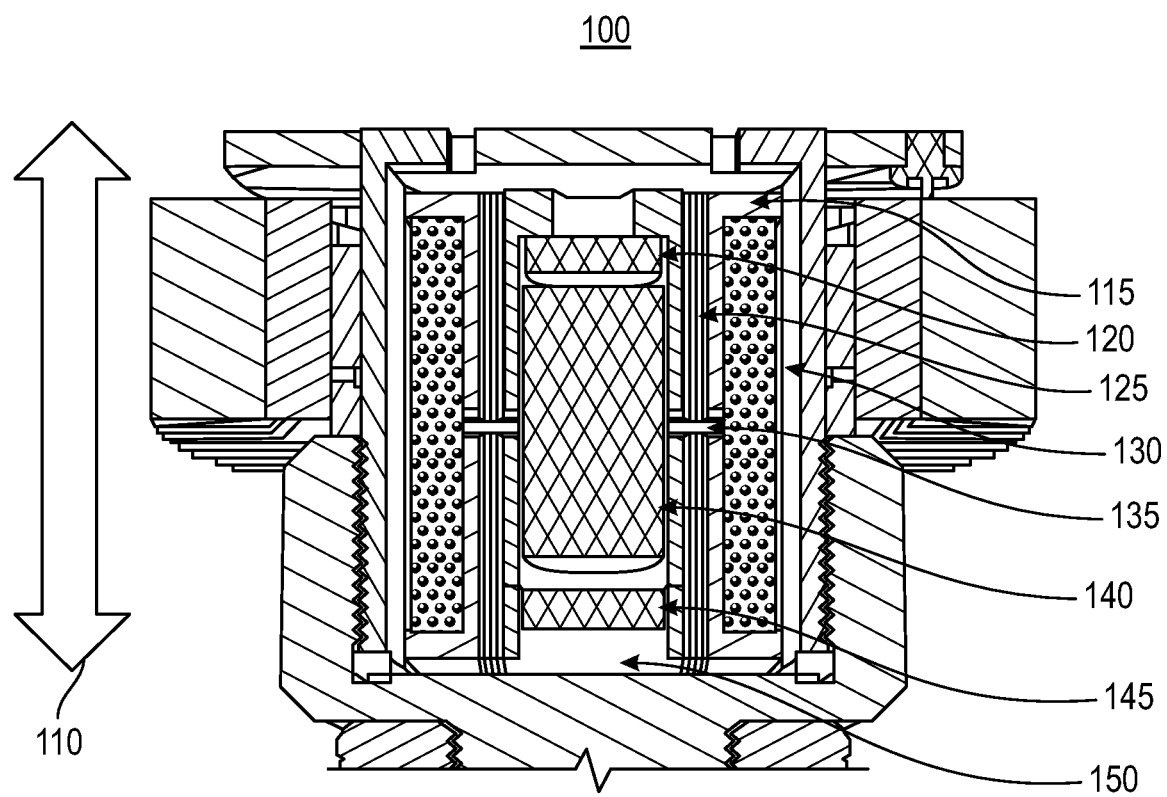
FIG. 1(a) illustrates an Electro-Magnetic Energy Harvesting in accordance with an embodiment of the invention.

Unless otherwise indicated illustrations in the figures are not necessarily drawn to scale.

DETAILED DESCRIPTION OF SOME EMBODIMENTS

Background and Context

The particular values and configurations discussed in these non-limiting examples can be varied and are cited merely to illustrate one or more embodiments and are not intended to limit the scope thereof.

Subject matter will now be described more fully herein after with reference to the accompanying drawings, which form a part hereof, and which show, by way of illustration, specific example embodiments. Subject matter may, however, be embodied in a variety of different form and, therefore, covered or claimed subject matter is intended to be construed as not being limited to any example embodiments set forth herein, example embodiments are provided merely to be illustrative. Likewise, a reasonably broad scope for claimed or covered subject matter is intended. Among other issues, subject matter may be embodied as methods, devices, components, or systems. The followed detailed description is, therefore, not intended to be interpreted in a limiting sense.

Throughout the specification and claims, terms may have nuanced meanings suggested or implied in context beyond an explicitly stated meaning. Likewise, phrases such as "in one embodiment" or "in an example embodiment" and variations thereof as utilized herein may not necessarily refer to the same embodiment and the phrase "in another embodiment" or "in another example embodiment" and variations thereof as utilized herein may or may not necessarily refer to a different embodiment. It is intended, for example, that claimed subject matter include combinations of example embodiments in whole or in part.

In general, terminology may be understood, at least in part, from usage in context. For example, terms such as "and," "or," or "and/or" as used herein may include a variety of meanings that may depend, at least in part, upon the context in which such terms are used. Generally, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. Similarly, terms such as a "a," "an," or "the", again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

One having ordinary skill in the relevant art will readily recognize the subject matter disclosed herein can be practiced without one or more of the specific details or with other methods. In other instances, well-known structures or operations are not shown in detail to avoid obscuring certain aspects. This disclosure is not limited by the illustrated ordering of acts or events, as some acts may occur in different orders and/or concurrently with other acts or events. Furthermore, not all illustrated acts or events are required to implement a methodology in accordance with the embodiments disclosed herein.

Unless defined otherwise, all technical and scientific terms used herein have the same meanings as commonly understood by one of ordinary skill in the art to which the disclosed embodiments belong. Preferred methods, techniques, devices, and materials are described, although any methods, techniques, devices, or materials similar or equivalent to those described herein may be used in the practice or testing of the present invention.

Although claims have been included in this application to specific enumerated combinations of features, it should be understood the scope of the present disclosure also includes any novel feature or any novel combination of features disclosed herein.

References "an embodiment," "example embodiment," "various embodiments," "some embodiments," etc., may indicate that the embodiment(s) so described may include a particular feature, structure, or characteristic, but not every possible embodiment necessarily includes that particular feature, structure, or characteristic.

Headings provided are for convenience and are not to be taken as limiting the present disclosure in any way.

Each term utilized herein is to be given its broadest interpretation given the context in which that term is utilized.

Terminology

The following paragraphs provide context for terms found in the present disclosure (including the claims):

The transitional term "comprising", which is synonymous with "including," "containing," or "characterized by," is inclusive or open-ended and does not exclude additional, unrecited elements or method steps. See, e.g., *Mars Inc.* v. *H.J. Heinz Co.*, 377 F.3d 1369, 1376, 71 USPQ2d 1837, 1843 (Fed. Cir. 2004) ("[L]ike the term 'comprising,' the terms 'containing' and 'mixture' are open-ended."). "Configured to" or "operable for" is used to connote structure by indicating that the mechanisms/units/components include structure that performs the task or tasks during operation. "Configured to" may include adapting a manufacturing process to fabricate components that are adapted to implement or perform one or more tasks.

"Based On." As used herein, this term is used to describe factors that affect a determination without otherwise precluding other or additional factors that may affect that determination. More particularly, such a determination may be solely "based on" those factors or based, at least in part, on those factors.

All terms of example language (e.g., including, without limitation, "such as", "like", "for example", "for instance", "similar to", etc.) are not exclusive of other examples and therefore mean "by way of example, and not limitation . . . ".

A description of an embodiment having components in communication with each other does not infer that all enumerated components are needed.

A commercial implementation in accordance with the scope and spirit of the present disclosure may be configured according to the needs of the particular application, whereby any function of the teachings related to any described embodiment of the present invention may be suitably changed by those skilled in the art.

The flowchart and block diagrams in the figures illustrate the architecture, functionality, and operation of possible implementations of systems and methods according to various embodiments. Functions noted in the block may occur out of the order noted in the figures. For example, two blocks shown in succession may, in fact, be executed substantially concurrently, or the blocks may sometimes be executed in the reverse order, depending upon the functionality involved.

Further, any sequence of steps that may be described does not necessarily indicate a condition that the steps be performed in that order. Some steps may be performed simultaneously.

The functionality and/or the features of a particular component may be alternatively embodied by one or more other devices that are not explicitly described as having such functionality/features. Also, various embodiments of the present invention need not include a device itself.

More specifically, as will be appreciated by one skilled in the art, aspects of the present invention may be embodied as a system and/or method. Furthermore, aspects of the present invention may take the form of a plurality of systems to enable gas meter to perform self-checking to determine its overall functioning without requiring a meter operator.

Introduction

Embodiments of the present invention include a system with a plurality of ways to generate energy. In several embodiments, energy is generated by thermo-electric generation, electro-magnetic generation, and piezo-electric generation. Energy management is then provided through the modules and sub-modules of the system based on the generated energy.

With the electro-magnetic energy generation, a suspension magnet oscillates between two levitation magnets and/or a spring. The suspension magnet oscillates with certain displacement to acceleration levels and frequency of vibration. Magnetic flux cuts across electrical coil windings to generate the energy that is harvested and provided to the modules and sub-modules.

With respect to thermo-electric generation, heat flows within the system from a cold plate to a heat sink and to the environment to establish a thermal gradient. A module transducer then converts the established thermal gradient to electrical energy.

In piezo-electric generation, a plurality of rollers are moved toward the piezo-electric beam. When the rollers are moved toward the piezo-electric beam, the frequency of vibration is tuned and the energy generation is optimized. The rollers are moved back and forth so that the piezo-electric beam is tuned for resonance frequency and so that maximum energy can be obtained.

Based on the generated energy according to the one or more methods described above, energy management is provided. The energy management includes energy supervision that monitors loading sub-modules power state transition sequence and storage module energy state computation. The loading sub-module's power profile management is also supervised through Energy Function parameters and Duty Cycle time-period optimization. A forecasting function is also provided. A loading sub-module's storage energy consumption behavior is predicted. Synchronous and asynchronous tasks are provided in relation to task activations and sub-module supervision. Sensor data generation also occurs. In addition, sensor data lifecycle takes place in relation to data persistence, communications, and processing.

System Structure

FIG. 1(a) illustrates an embodiment where an AWSN 100 generates energy. The AWSN includes vibration axis 110, a coil and bobbin assembly 115, a levitation magnet 120, a relief air vent 125, 135, coils 130, suspension magnet 140, levitation magnet 145, and a frequency tuning arrangement 150.

In FIG. 1(a), to create energy, the suspension magnet 140 will levitate between the levitation magnets 120, 145. As the system vibrates the suspension magnet 140 will oscillate between the levitation magnets 120, 145. The suspension magnet 140 will oscillate with a certain displacement with respect to certain acceleration levels and frequency of vibration. The relief air vents 125, 135 will minimize friction as the suspension magnet 140 is oscillating. As the suspension magnet 140 is oscillating, magnetic flux will then cut across the electrical coil endings or coils 130. The magnetic flux cutting across the coils 130 generates energy. The generated energy will then be harvested by the AWSN 100 to power modules within the AWSN 100. The vibration frequency tuning arrangement 150 will adjust the desired power at various vibration frequencies accordingly.

Figure 1B:
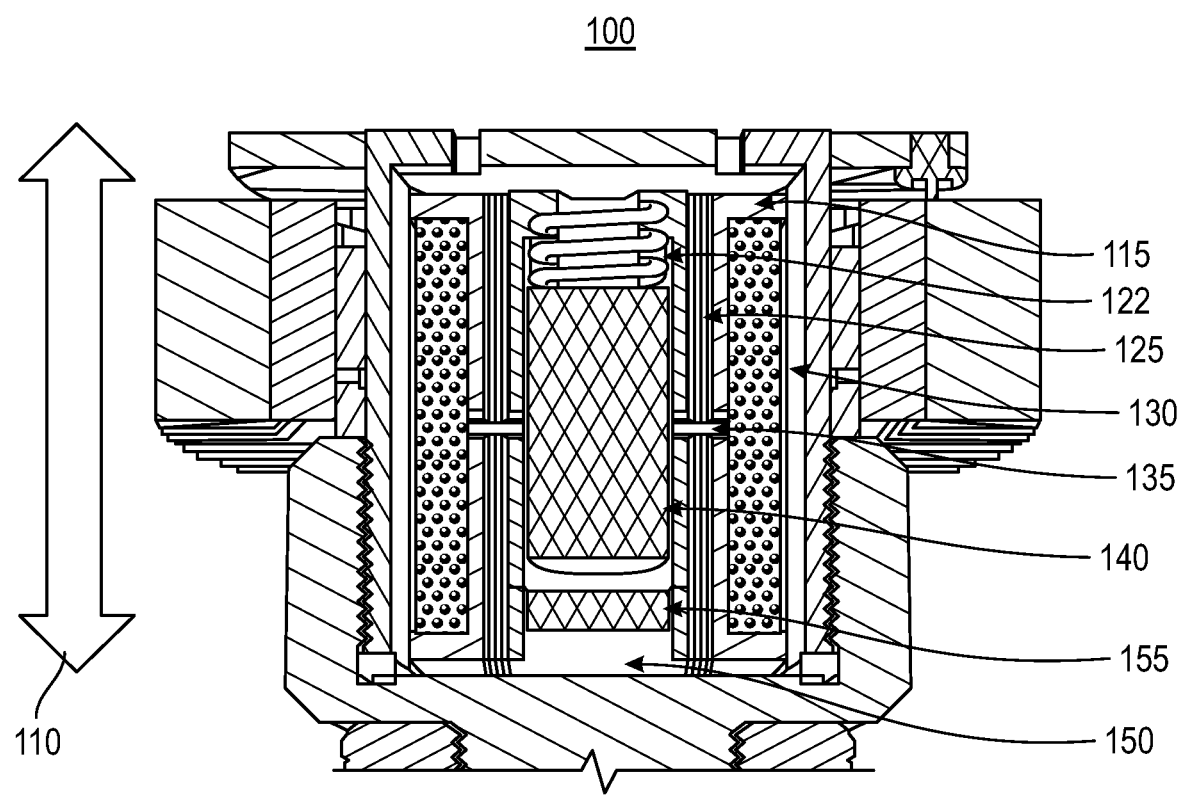
FIG. 1(b) illustrates another embodiment of the Electro-Magnetic Energy Harvesting in accordance with the invention.

FIG. 1(b) illustrates another embodiment of an AWSN 100 generating energy. The elements of FIG. 1(b) are substantially the same as FIG. 1(a). A magnet 155 is positioned below the suspension magnet 140, and a spring 122 is positioned above the suspension magnet 140. To generate the energy, the suspension magnet 140 oscillates with certain displacement with respect to the acceleration levels and frequency of vibration. The magnetic attractive forces thereby pull the suspension magnet 140 and also stretch the spring 122. As the magnetic flux cuts across the coils 130, the energy is then generated. Moreover, as the suspension magnet 140 is oscillating, the relief air vents 125, 135 can minimize the friction of the suspension magnet 140 while the suspension magnet 140 is oscillating. In addition, the vibration frequency tuning arrangement 150 can adjust the desired power at various vibration frequencies.

Figure 1C:
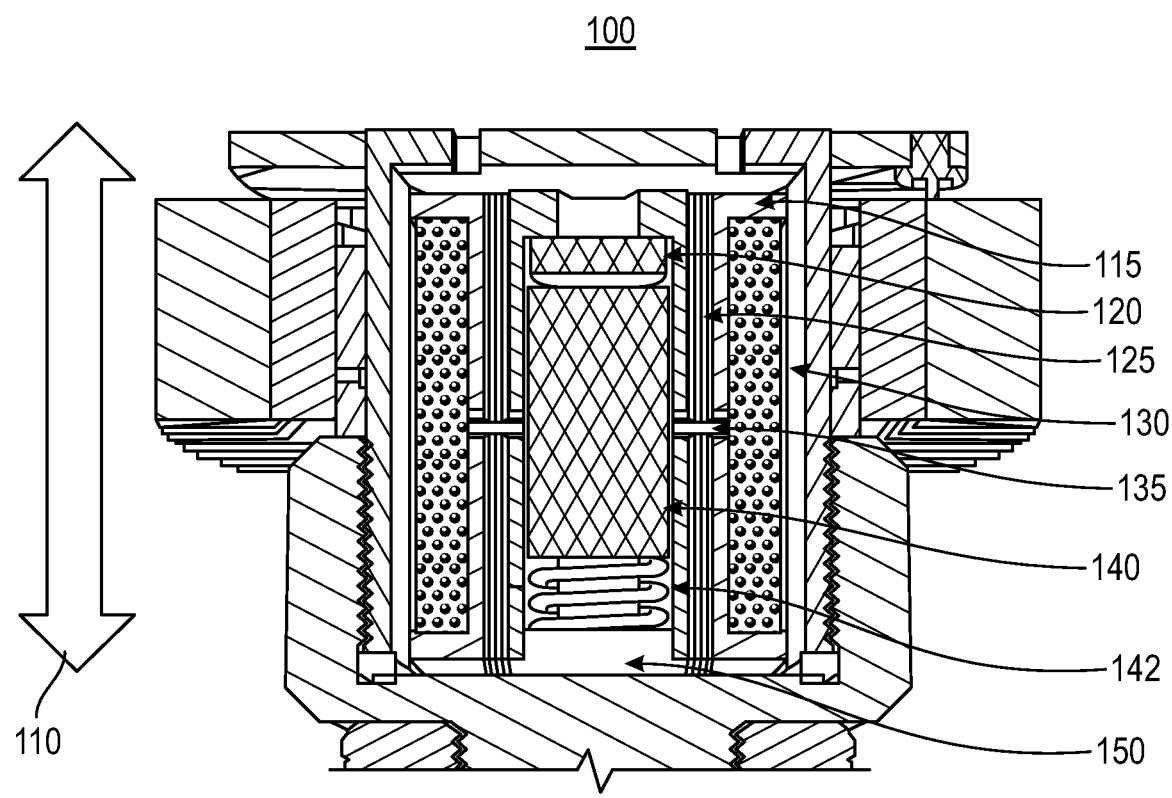
FIG. 1(c) illustrates an Electro-Magnetic Energy Harvesting in accordance with an embodiment of the invention.

In FIG. 1(c), the AWSN 100 will have substantially the same configuration as in FIGS. 1(a) and 1(b). The AWSN 100 will include a coil bobbin 115, magnet 120, relief air vents 125, 135, coils 130, suspension magnet 140, spring 142, and frequency tuning arrangement 150.

Referring to FIG. 1(c), the spring 142 is configured below the suspension magnet 140. The suspension magnet 140 has a specific mass and is suspended with the spring 142 configured underneath the suspension magnet 140. The magnet 120 is configured above the suspension magnet 140. The suspension magnet 140 is configured to oscillate with certain displacement with respect to the acceleration levels and frequency of vibration. The magnetic attractive force pulls the suspension magnet 140, and the spring 142 is stretched. As a result potential energy is created. Moreover, when the suspension magnet 140 oscillates, the magnetic flux cuts across the coils 130 to generate the energy. During the oscillation of the suspension magnet 140, the relief air vents 125, 1.35 will minimize the friction due to the oscillation of the suspension magnet 140. In addition, the vibration frequency tuning arrangement 150 will adjust the power at various vibration frequencies. As such, the generated energy can then be harvested to power the modules within the AWSN 100.

Figure 2A:
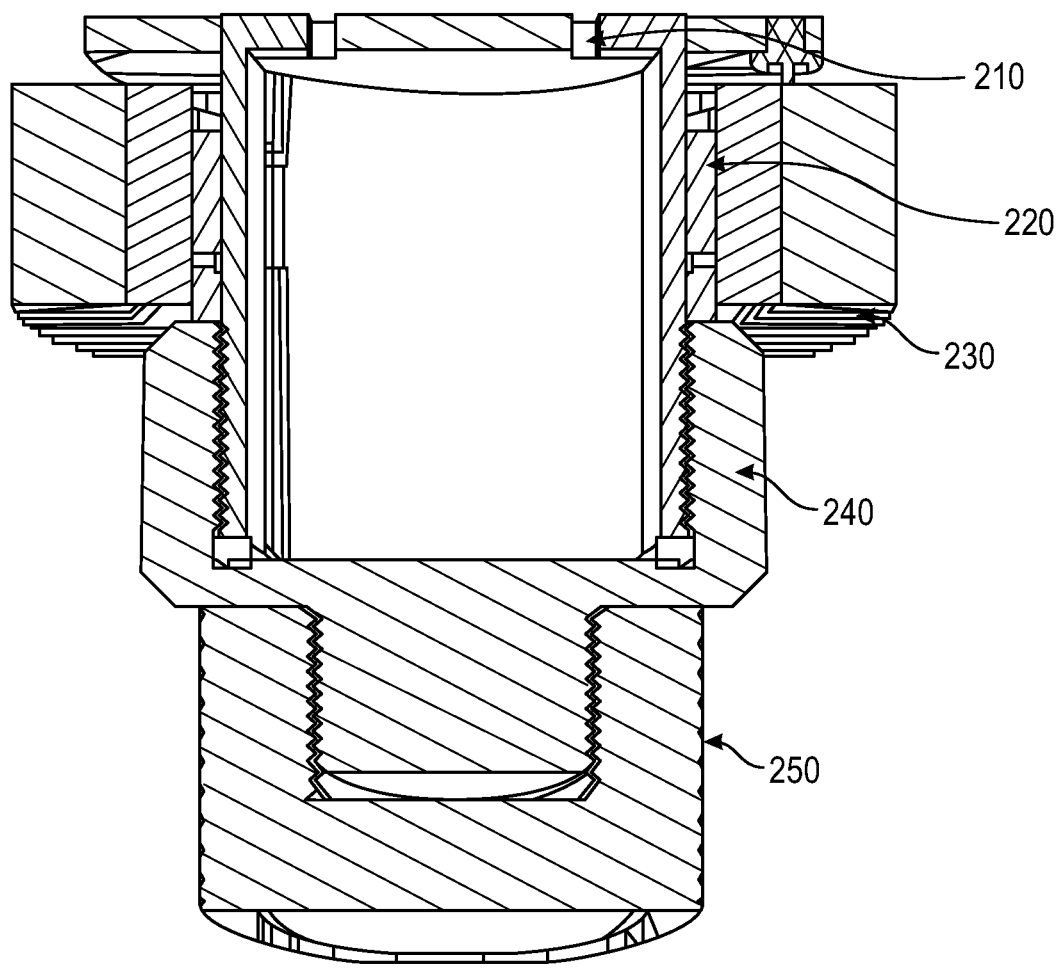
FIG. 2(a) illustrates a TEG Energy Harvesting system in accordance with an embodiment of the invention.

Referring to FIG. 2(a), a thermo-electric energy (TEG) harvesting module system, or system 200 is illustrated. The system 200 is configured within an AWSN. The system 200 includes an aperture 210 for TEG wiring, a thereto-electric generator (Peltier/Thermopiles) 220, a copper/aluminum heat sink 230, a heat conductive metal housing 240, and a clamping metal adapter 250. The number of TEG elements/modules can be increased based on any energy requirements.

In FIG. 2(a), the TEG modules can be pettier or thermopile modules 220. In the system 200, one surface of a plate shall be attached to the heat conductive metal housing 240 with a high conductivity heat sink paste or adhesive tape to remove the air pockets for better efficiency. On the other hand, the other surface of the plate is attached to a diametrical or any other shapes of a heat sink that are made of copper or aluminum or the copper/aluminum heat sink 230. The aperture 210 for the TEG wiring is present to harvest the electrical energy that is generated. The clamping metal adapter 240 is configured to transfer heat for harvesting the power.

Figure 2B:
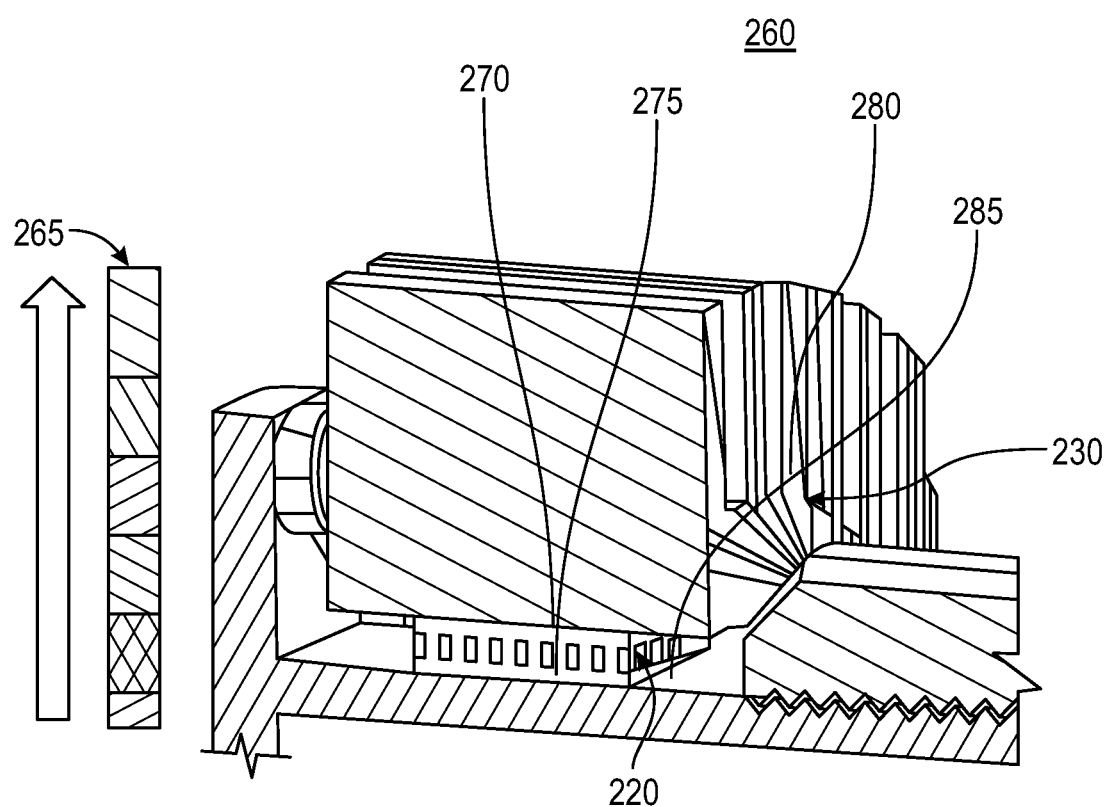
FIG. 2(b) illustrates a Peltier/Thermopile TEG assembly in accordance with an embodiment of the invention.

In FIG. 2(b), another side of a system 260 for harvesting energy is illustrated. The system 260 is also configured with the AWSN 100 shown in FIGS. 1(a)-(c). The system 260 is configured with a cold plate 270, a hot plate 275, the copper/aluminum heat sink 230, and the TEG Peltier/Thermopiles 220. Also illustrated is a thermal gradient 265 and various modules 280, 285.

With respect to FIG. 2(b), a diametrical heat sink arrangement will be attached to the hot plate 275 or the cold plate 270. The number of modules that receive the generated energy can be increased based on the energy requirements. The modules can also be the TEG pettier/thermopiles 220.

Figure 3A:
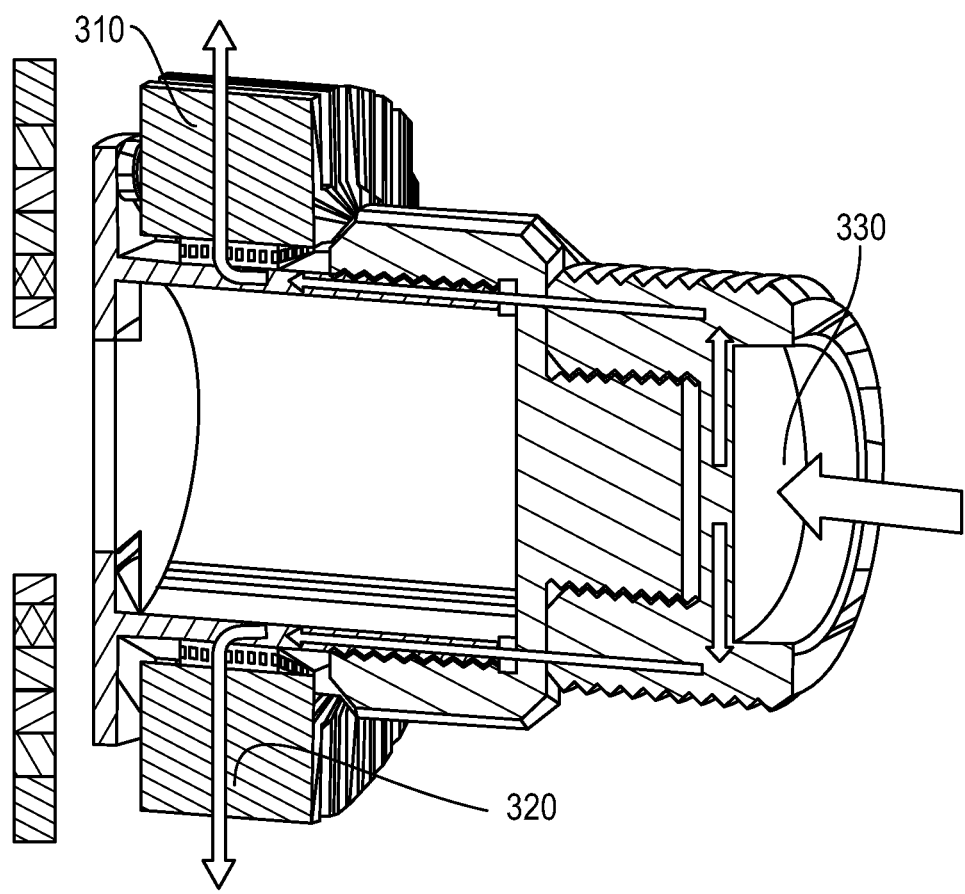
FIG. 3(a) depicts a thermal flow diagram in accordance with an embodiment of the invention.

In FIG. 3(a), a flow diagram 300 of a positive thermal gradient 330 is illustrated. The positive thermal gradient 330 can be configured within an AWSN. Cold regions 310, 320 are also illustrated. Power is scavenged from the positive thermal gradient 330. Heat from the target application flows through the mounting metal bracket to the hot plate and then to the cold plate. Further, the heat from the cold plate flows to a heat sink and then the environment. As the heat flows to different parts of the modules, the positive thermal gradient 330 is established across the TEG module. As such, the positive thermal gradient 330 will be converted to electrical energy by a TEG module transducer or the like. The generated electrical energy will be coupled to the electronic circuits within the AWSN to harvest and power the sensors and other peripherals within the AWSN.

Figure 3B:
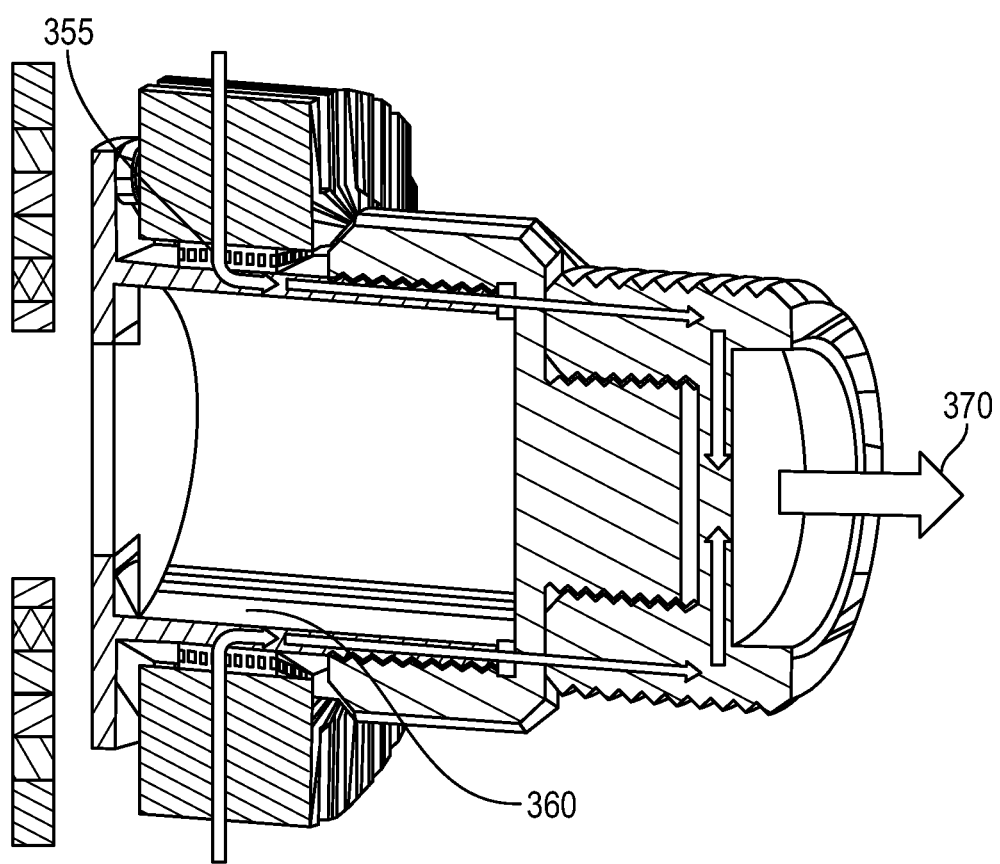
FIG. 3(b) depicts another thermal flow diagram in accordance with an embodiment of the invention.

Referring to FIG. 3(b), a negative thermal gradient 350 is illustrated. Hot regions 355, 360 and a cold region 370 are shown. Power is then scavenged or taking from the negative thermal gradient 350. In this instance, heat from the environment flows to the heat sink, and then to the hot plate, the cold plate, and then to other TEG elements/modules within the AWSN 100. The heat in the cold plate also flows to either the target application or to another heat sink. As the heat is flowing to different parts of the, the negative thermal gradient 350 is established. Moreover, as with the positive thermal gradient 330, the negative thermal gradient 350 will be converted to electrical energy by a TEG module transducer or the like. In addition, the generated electrical energy is harvested and provided to the modules and sensors within the AWSN.

Figure 4A:
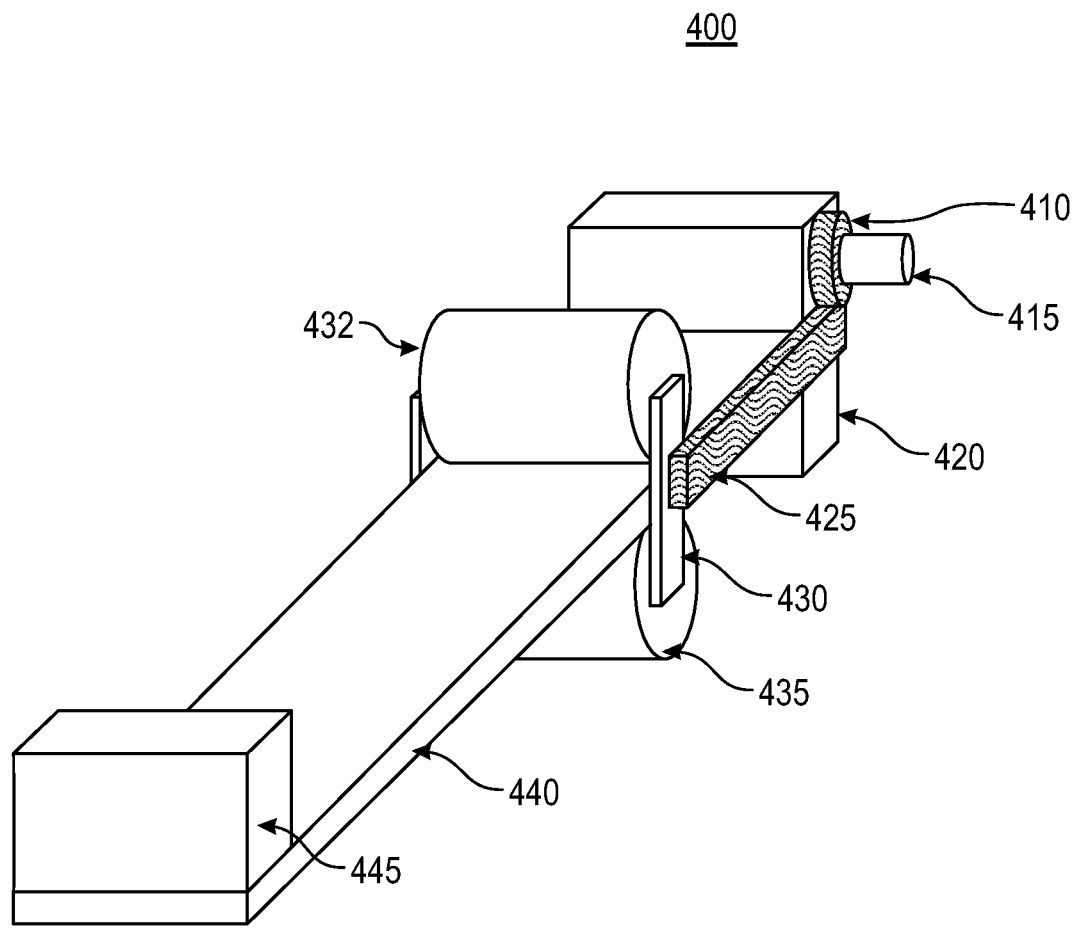
FIG. 4(a) illustrates a piezo-electric energy harvesting apparatus in accordance with an embodiment of the invention.

In FIG. 4(a), a piezo-electric energy (PEG) harvesting apparatus 400 is illustrated, which can be configured within the AWSN. The PEG harvesting apparatus 400 includes pinion gear 410, an adjusting screw 415, cantilever base 420, rack (gear) 425, a rollers beam support assembly 430, a roller (1,2) 432, 435, a piezo electric beam 440, and a mass 445.

With respect to FIG. 4(a), the piezo-electric beam 440 on one end of the PEG harvesting apparatus 400 is attached to the cantilever base 420. The free end of the cantilever beam is attached with the mass 445. The rollers beam support assembly 430 tunes the frequency of vibration for optimizing the energy generation of the AWSN 100. Roller 1 and 2, 432, 435 also form the support for the cantilever beam. A roller hinge is attached with the rack (gear) 425 and pinion gear 410 to move roller 1 432 and roller 2 435 back and forth. The roller 1 432 and roller 2 435 moving back and forth manually can enable the piezo electric beam 440 to be tuned for resonance frequency. Tuning the piezo electric beam 440 for resonance frequency can allow maximum energy to be obtained.

Figure 4B:
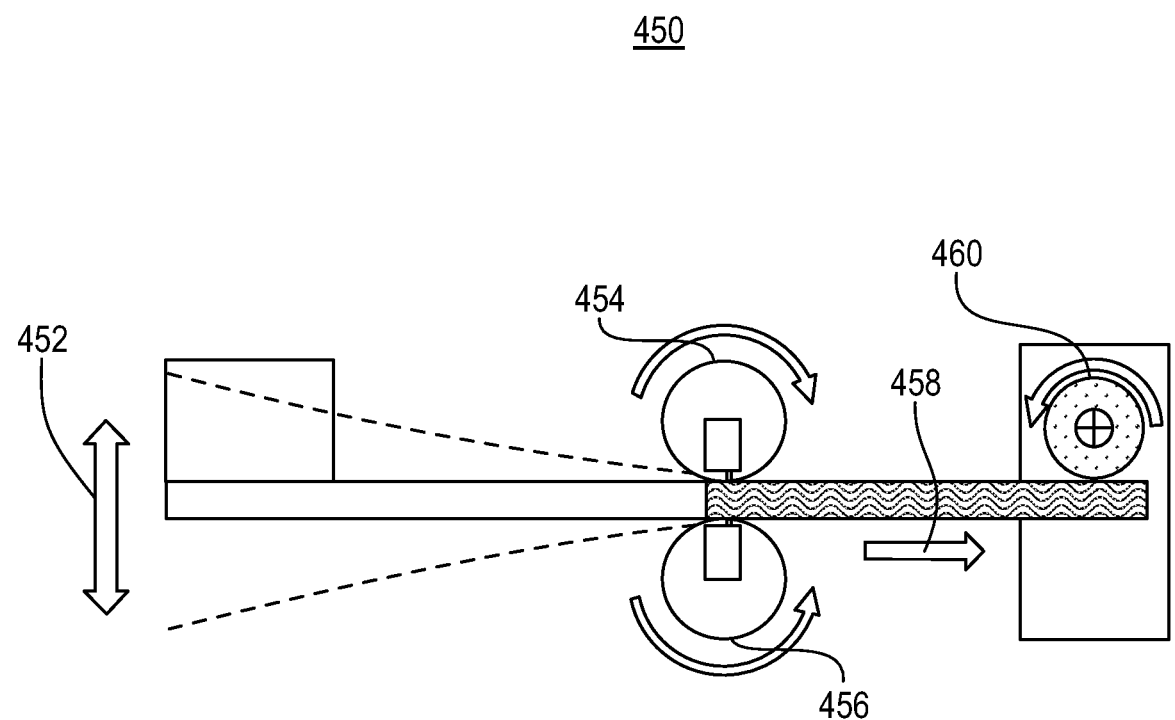
FIG. 4(b) illustrates a frequency tuning apparatus in accordance with an embodiment of the invention.

FIG. 4(b) shows a frequency tuning-pinion screw arrangement 450 that is anti-clockwise. The frequency tuning-pinion screw arrangement 450 includes a roller 1 454 and a roller 2 456. Also shown is a rack 458, an anti-clockwise pinion 460, and a vibration axis 452.

Figure 4C:
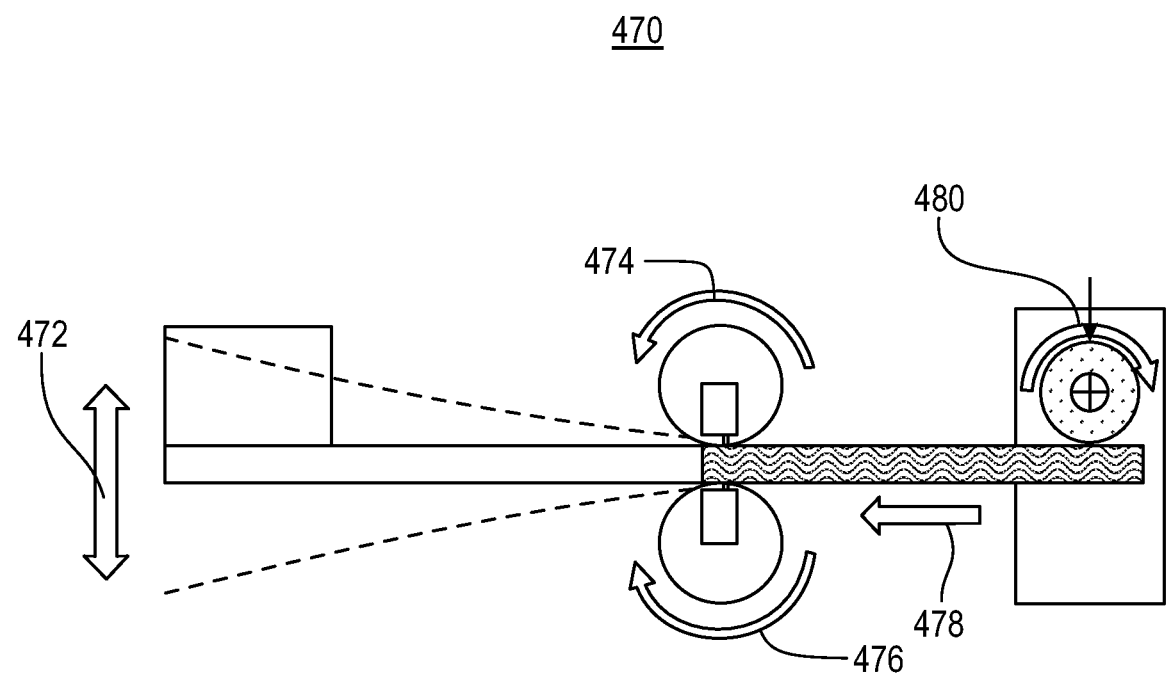
FIG. 4(c) illustrates another frequency tuning apparatus in accordance with an embodiment of the invention.

In FIG. 4(c), the frequency tuning-pinion screw arrangement 450 is rotated anti-clockwise to generate maximum energy. The generated energy is then harvested and distributed to various modules within the AWSN.

FIG. 4(c) shows a frequency tuning pinion screw arrangement 470 that is clockwise. The frequency tuning pinion screw arrangement 470 includes a roller 1 474, a roller 2 476, a rack 478, and a pinion 480 that is clockwise and a vibration axis 472. The frequency tuning pinion screw arrangement 470 is rotated clockwise to generate the maximum energy. The generated maximum energy is harvested to be provided to the modules within the AWSN.

Figure 5:
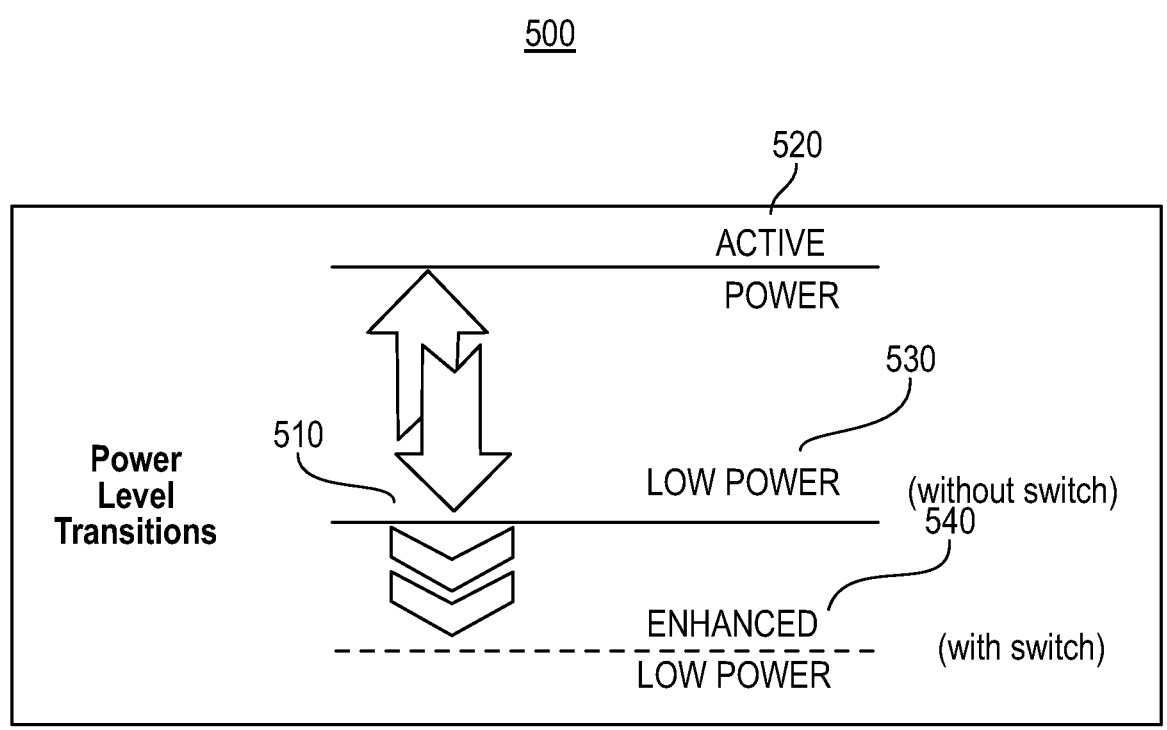
FIG. 5 illustrates power level transitions in accordance with an embodiment of the invention.

FIG. 5 illustrates logical power level transitions 500 within the AWSN 100. An active power state 520, a low power state 530 without a switch, and an enhanced low power state 540 with a switch are shown. The power level transitions 510 between the active power state 520, the low power state 530, and the enhanced low power state 540 are also illustrated.

In FIG. 5, unforeseen energy conservation problems are avoided. The low energy or low power state 530 is reduced to an open-circuit state. In the open circuit state, the loading subsystems are isolated from storage module. As such, the low power state 530, with a switch, is switched to enhanced low power state. The energy storage is disconnected from the consumers. The lower power state is facilitated by a combination of pica ampere switches with low power system design configurations. As such, the lowered low power state or enhanced low power state 540 contributes to a large operational energy margin savings. As such, the low power state 530 without the switch is transformed into enhanced low power state with the switch 540 thereby contribute to a large magnitude of operational energy margin and savings. Numerous formats have design choices that incline on energy consumption optimizations in the active power state 520 while ignoring possible optimizations in the low power state 530. The proposed equation expands design space energy horizons:

III. Proposed Methodology $$\Sigma i_{switch} << \Sigma i_{sleep}$$ Equation. 1 System Currents Summation In FIG. 5, the summation on the left (i_switch) ha a low quiescent current switch enables a design for the enhanced low power state 540. The right side of the summation (i_sleep) indicates a summation of the current drain without the power switch scheme at the low power state 530. A design of the AWSN according to the strategy shown above gives a significant increase in energy efficiency margins and prevents over-compensation above minimum viable storage energy capacity.

Figure 6:
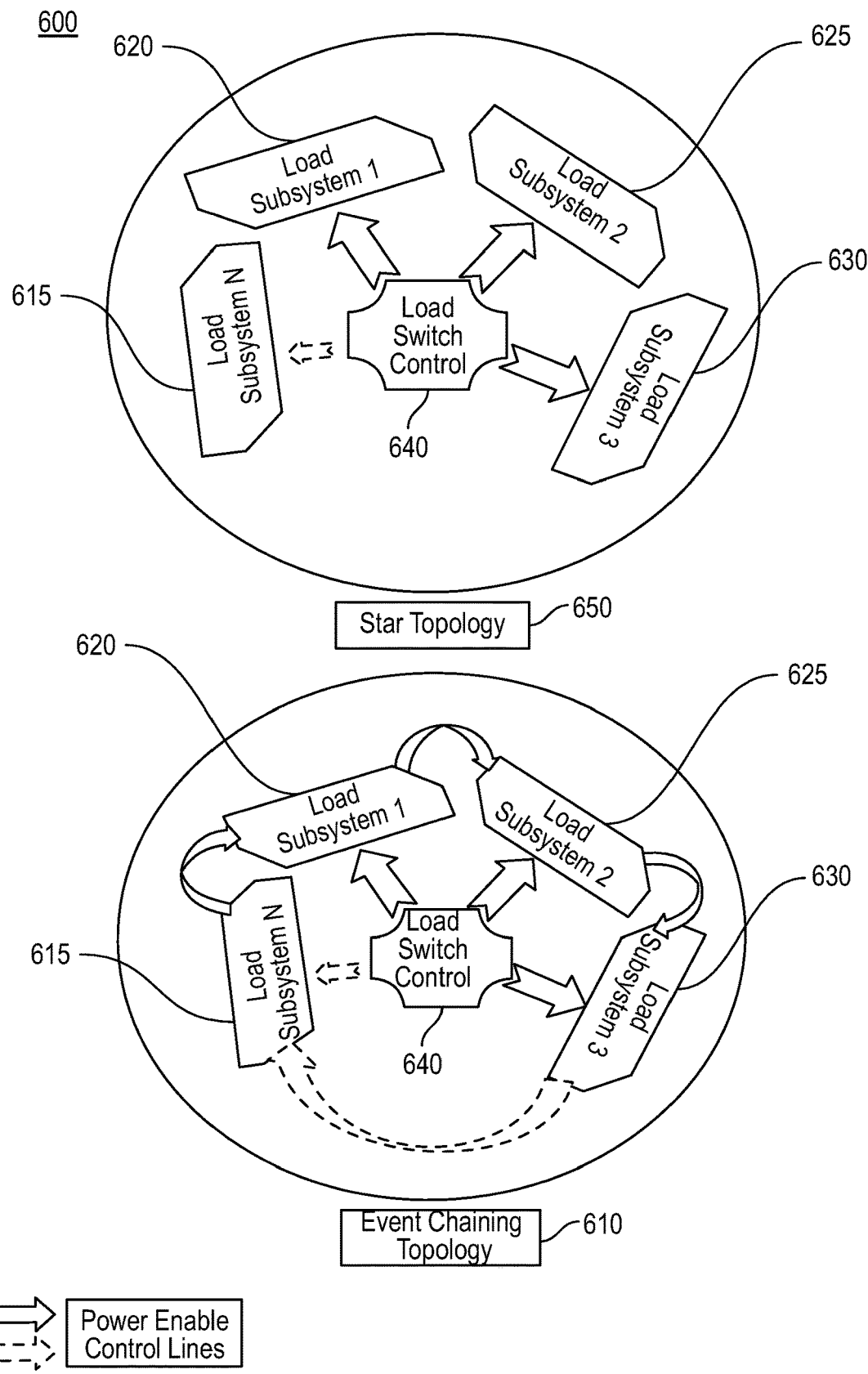
FIG. 6 depicts star topology and event chaining topology system in accordance with an embodiment of the invention.

FIG. 6 depicts a topology system 600. The topology system 600 includes an event chaining topology 610, load subsystem N 615, load subsystem 1 620, load subsystem 2 625, load subsystem 3 630, load switch control 640, and a star topology 650. Numerous potential switching topologies can be employed for the AWSN. A convenient assembly can be with a singular control switch or load switch control 640 that routes all energy requests within the AWSN 100 based on an appropriate decision to direct linked switches of each subsystem (615, 620, 625, 630) such as in the star topology 650.

In FIG. 6, however, an effective alternative would be chaining each subsystem (615, 620, 625, 630) to propagate energy as a coordinated event such as in event chaining topology 610. Check-pointing from a main system controller or the load switch control 640 can occur where the load switch control 640 operates at the least possible power state. The event chaining topology 610 is the most effective topology at reducing control overhead and context switching processing. Nevertheless, a single link catastrophe can affect the overall sequence of commands. Referring back to the star topology 650, independent energy request paths established allows for a high granular level of power management. A hybridization of the event chaining topology 610 and star topology 650 can be adapted. Based on the hybridization, a new supplementary arrangement recommends logical grouping of individual load subsystems (615, 620, 625, 630) based on primary objectives that are pertinent to the relative grouping. The star topology 650 and the event chaining 610 hybridization can be utilized for the AWSN embodiments shown above.

Figure 7:
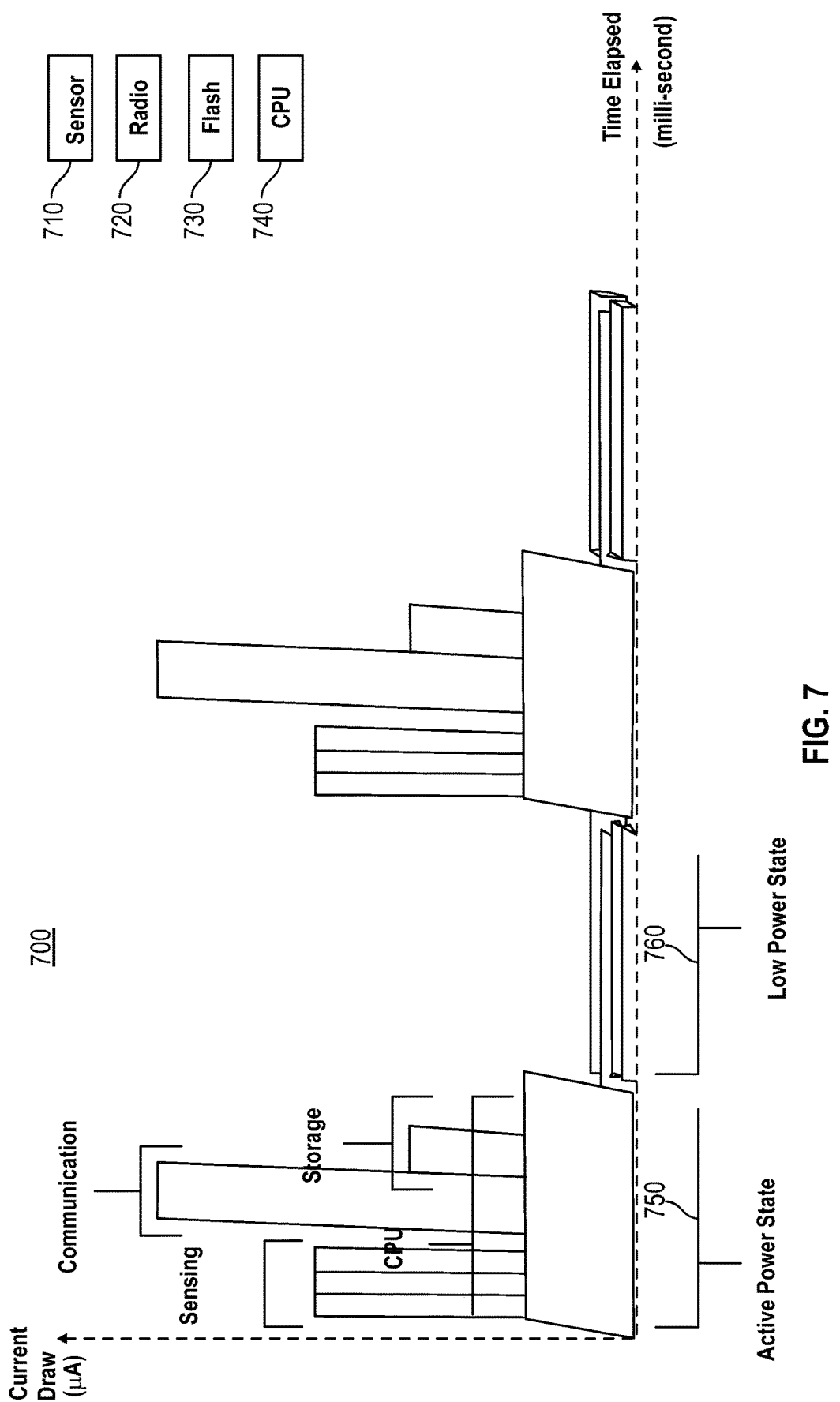
FIG. 7 illustrates a current consumption profile graph in accordance with an embodiment of the invention.

With regard to FIG. 7, a wireless-sensing system 700 is shown. The wireless-sensing system 700 shows graph illustrations for a sensor 710, radio 720, flash. 730, and CPU 740. An active power state 750 is shown with the sensing, CPU, communication, and storage in the graph illustrations associated with the sensor 710, CPU 740, radio 720, and flash 730 respectively. A lower power state 760 is also shown. In contrast to generic computing systems, the wireless-sensing system 700 is restricted in each comparative dimension to levels that are required by necessary supporting tasks that collectively work to accomplish a shared objective. The wireless-sensing system 700 can combine tasks that are synchronous relative to a pre-determined timing criterion or are asynchronous relative to an episodic incident. A task execution can go from the active power state 750 to the low power state 760.

In FIG. 7, with respect to the active power state 750, each task requests for certain units of energy from an available capacity. The aggregate energy can be defined as a summation of product of operating voltage and current sink and the time duration in the active state. The aggregate energy can be described in the formula:

$$\Delta E = \sum_{n=1}^{m} \Delta t_n * V * i_n$$ Equation. 2

Energy Consumption Formula $i$ = current sink(amps)   $V$ = Voltage(volts)   $t$ = time(seconds)

$m$ = Task Count $E$ = Energy Consumed(Joules)

In FIG. 7, derivation of the aggregate energy can also be extended to gauge the low power state 760 energy drain for each task. Every programming model is crafted to optimize the energy draw patterns to achieve a specific design rationale. The energy drain in the low power state 760 is exponentially decreased with the power switch topology that grants energy isolation at the termination of an associated task. To maintain the ratio of available energy to energy drain, parameters of the energy function are thereby modulated for each particular task. Rate of execution of tasks are factorizations of a main system clock rate that has an equivalent current sink expressed as a common factor of a current drawn proportional to an operational clock frequency. The higher the frequency, the greater the current that is required to execute tasks faster. As such, there are other dimensions that grant convenient ways to enhance energy savings. For instance, intermittent tasking with intermediate state retention or delayed period repetitions provide quality power savings without sacrificing reliability under operational objectives.

In FIG. 7, the ratio of energy depleted over time expresses the principle, wherein increasing the time contributes toward extended usage of a remnant capacity. The synchronous systems describe this as a duty-Cycle with a Duty-Cycle value proportional to energy consumption. The Duty Cycle can be represented by the following equation $$\text{Duty Cycle} = \frac{T_{active\_power}}{T_{active\_power} + T_{low\_power}}$$ Equation. 3

$T$ = Time Duration

Duty Cycle Formula

Figure 8:
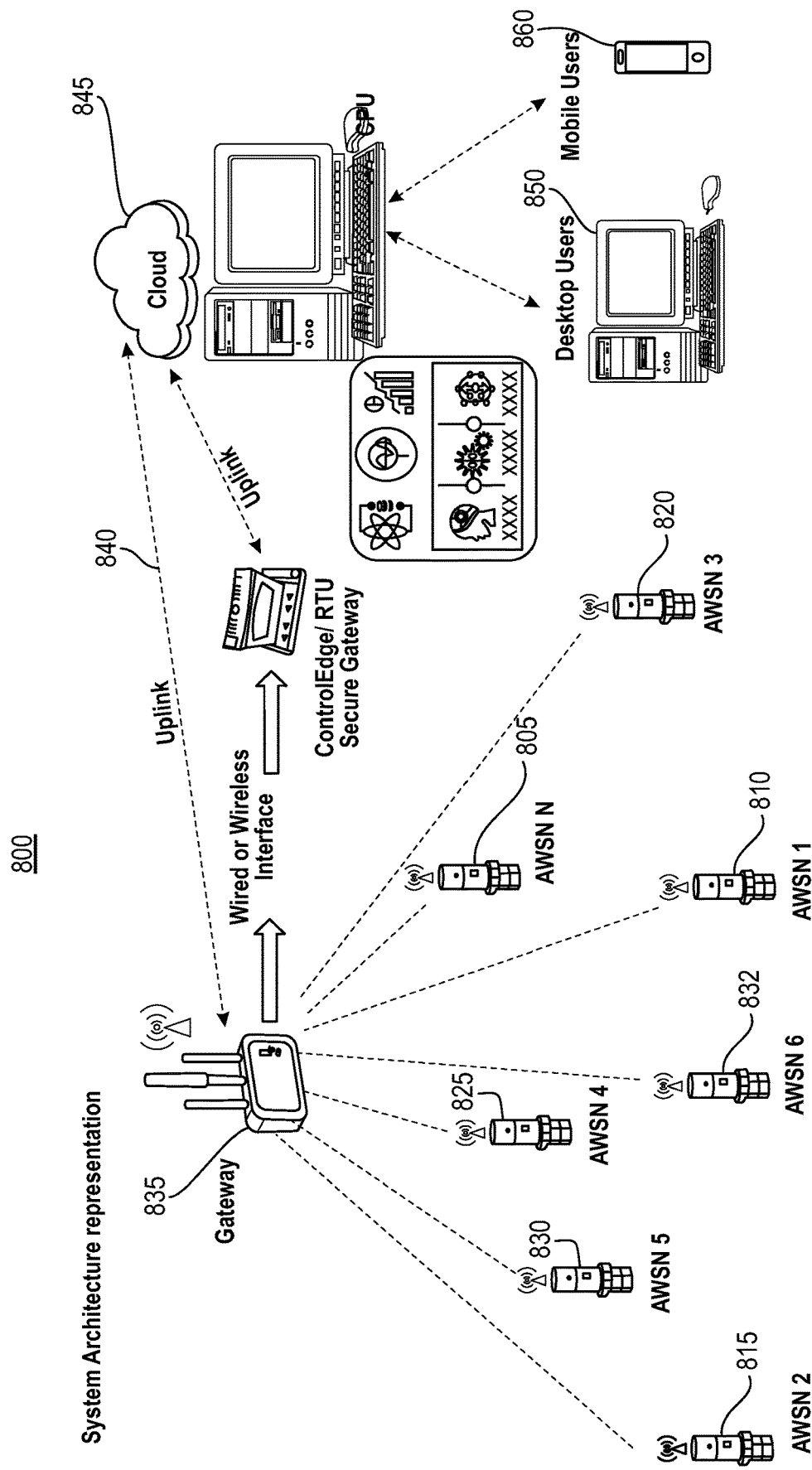
FIG. 8 depicts a system architecture in accordance with an embodiment of the invention.

FIG. 8 illustrates a system 800 which an AWSN can be a part of. In the system 800, AWSN N 805, AWSN 1 810, AWSN 2 815, AWSN 3 820, AWSN 4 825, AWSN 5 830, and AWSN 6 832 are illustrated. Each AWSN can interact with a gateway 835, an uplink 840, and cloud 845. Desktop users 850 and mobile users 860 are also shown. The AWSN's 805-832 are mounted at various locations of sensing interest. The AWSN's 805-832 acquire data and generate their own power. Each of the AWSN's 805-832 are self-powered and harvest energy for their internal modules as described in the prior figures. Each AWSN 805-832 transfer data to the cloud 845 through the gateway 835 by means of a wireless or wired communication. The AWSN's 805-832 perform edge inferencing through algorithms and transfer the inferred data to the cloud 845. The AWSN's 805-832 perform advanced edge inferencing using artificial intelligence and machine learning techniques and transfer the result to the cloud 845.

Figure 9:
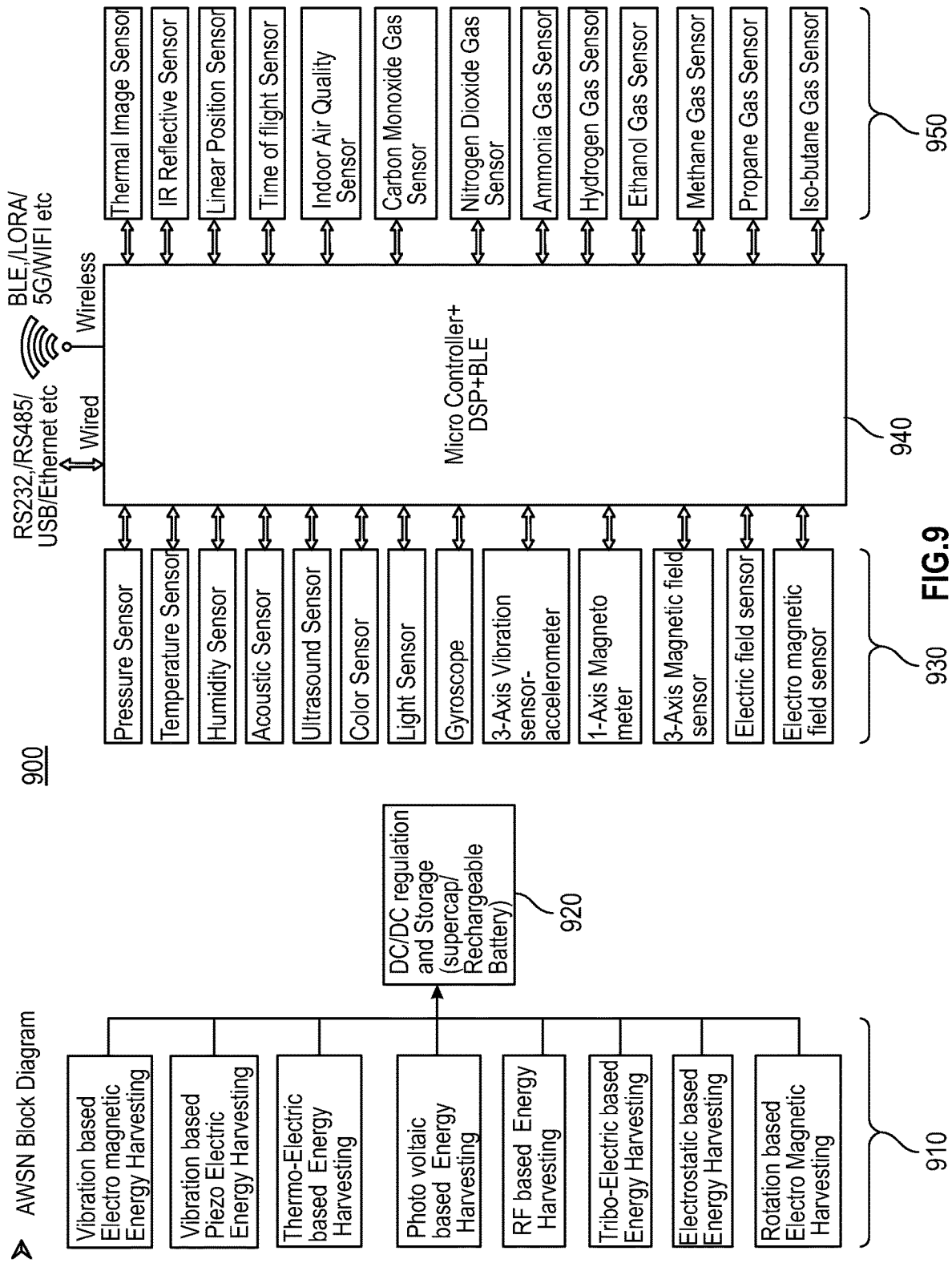
FIG. 9 illustrates a AWSN block diagram in accordance with an embodiment of the invention.

In FIG. 9, an internal block diagram 900 of an AWSN 100 is illustrated in more detail. A harvesting section 910 is illustrated. The harvesting section 910 can include rotation based electro magnetic harvest, electrostatic based energy harvesting, tribo-electric based energy harvesting, electrostatic based energy harvesting, RF based energy harvesting, photo-voltaic based energy harvesting, thereto-electric based energy harvesting, vibration-based piezo electric energy harvesting, and vibration-based electro magnetic energy harvesting. The harvesting section 910 is connected to a energy regulator along with storage element such as super-capacitor or rechargeable battery 920. A sensor section 930 is also configured within the AWSN. The sensor section 930 includes an electro-magnetic field sensor, electric field sensor, 3-axis magnetic field sensor, 1-axis magneto meter, 3-axis vibration sensor-accelerometer, gyroscope, light sensor, color sensor, ultrasound sensor, acoustic sensor, humidity sensor, temperature sensor, and pressure sensor.

Referring to FIG. 9, the sensor section 930 is connected to a micro-controller 940. The micro-controller 940 is connected to a sensor section 950. The sensor section 950 includes an iso-butane gas sensor, propane gas sensor, methane gas sensor, ethanol gas sensor, hydrogen gas sensor and ammonia gas sensor. In addition, the sensor section 950 includes a nitrogen dioxide gas sensor, carbon monoxide gas sensor, indoor air quality sensor, time of flight sensor, linear position sensor, IR reflective sensor, and a thermal image sensor.

Figure 10:
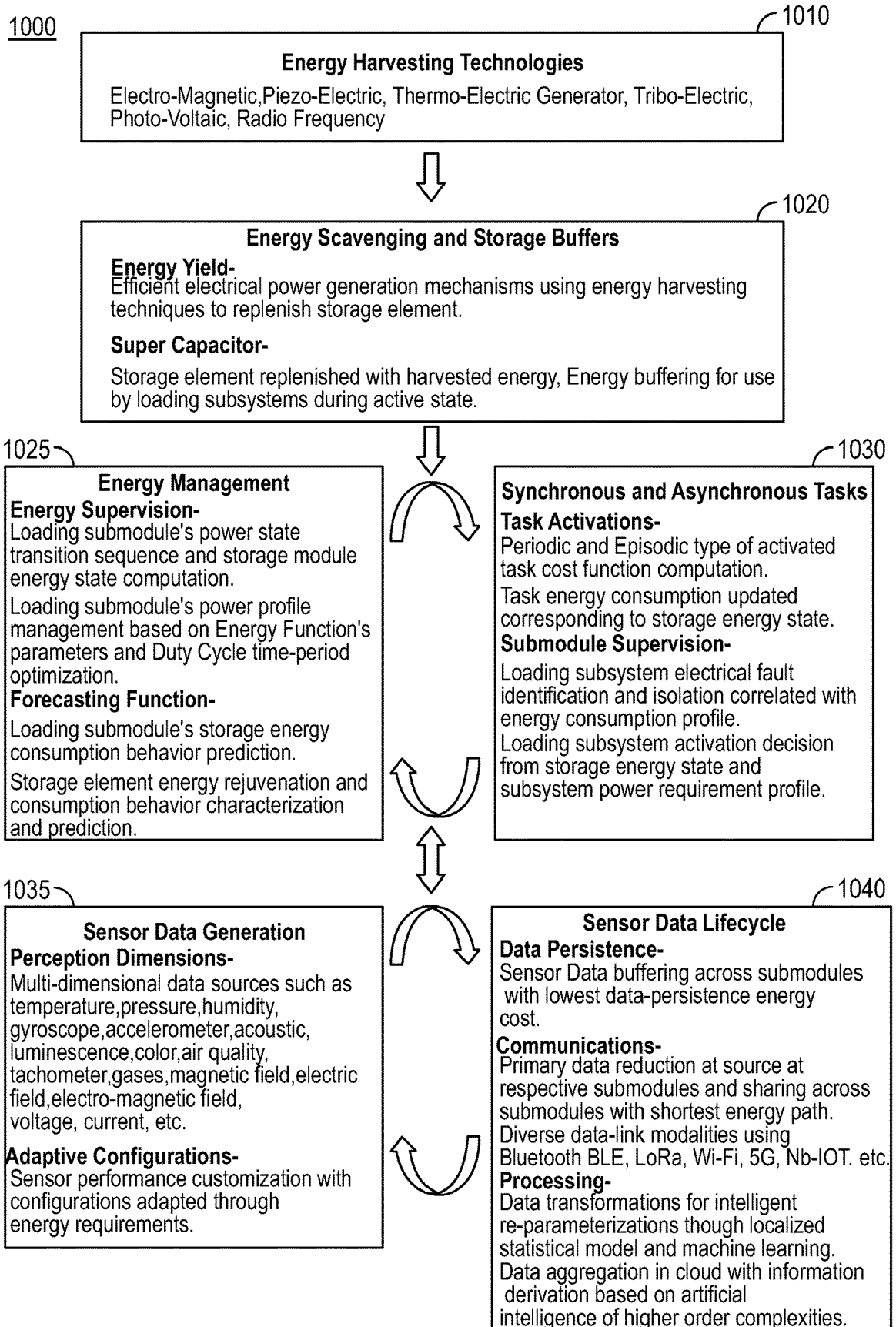
FIG. 10 depicts a AWSN flow diagram in accordance with an embodiment of the invention.

FIG. 10 illustrates a flow diagram 1000 of the invention. At 1010, energy harvesting technologies are illustrated. The various energy harvesting technologies are described above in FIGS. 1-4(c). The various energy harvesting technologies that can be used for the invention include electro-magnetic, piezo-electric, thermo-electric generation, tribo-electric, photo-voltaic, and radio frequency harvesting.

In FIG. 10, at 1020, energy scavenging and storage buffers are described. Energy scavenging can occur after the energy is generated based on the methods described in FIGS. 1(a)-4(c). Energy yield will include efficient electrical power generation mechanisms that use energy harvesting techniques to replenish a storage element. With regard to a super capacitor, a storage element is replenished with the harvested energy using one of the energy harvesting technologies mentioned above. Energy buffered in storage element is consumed by subsystems during an active state.

Referring to FIG. 10, at 1025, energy management is illustrated. The energy management includes both energy supervision and forecasting. With energy supervision, a power state's transition control sequence and storage module energy state computation is performed. In addition, the loading sub-module's power profile management is performed based on energy function parameters and a duty cycle time-period optimization. The forecasting includes loading sub-module's storage energy consumption behavior prediction. Further, the forecasting function includes storage element energy rejuvenation and consumption behavior characterization and prediction.

In FIG. 10, at 1030, synchronous and asynchronous task activations occur. The synchronous and asynchronous task activations can occur after or concurrently with the energy management described above. Periodic and episodic types of activated task cost function computations take place. Further, task energy consumption is updated in correspondence to a storage energy state. With sub-module supervision, the loading sub-system's electrical fault identification is performed in correlation with an energy consumption profile. In addition, the loading sub-system's activation decision from a storage energy state and power requirement profile is also performed.

In reference to FIG. 10, at 1035, sensor data generation is described. Perception dimensions include multi-dimensional data sources. The data sources include temperature, pressure, humidity, gyroscope, accelerometer, acoustics, luminescence, and color. The data sources also include air quality, tachometer info, gases, magnetic field information, electric field information, electro-magnetic field information, voltage, and current. Adaptive configurations include sensor performance customization with configurations that are adapted through energy requirements.

In FIG. 10 at 1040, data persistence includes sensor data that buffers across sub-modules with lower data-persistence energy cost. Communications include primary data reduction. The primary data reduction occurs at the source at respective sub-modules with sharing across sub-modules with the shortest energy path. Diverse data-link modalities include Bluetooth BLE, LoRA, Wi-Fi, 5G, and Nb-IOT. Processing includes data transformations for intelligent re-parameterizations though localized statistical modeling and machine learning. Data aggregation occurs in the cloud with information derivation based on artificial intelligence of higher order complexities.

Those skilled in the art will appreciate that the example embodiments are non-exhaustive and that embodiments other than that described here may be included without departing from the scope and spirit of the presently disclosed embodiments.

Advantages

The AWSN described above is different from current technology. The AWSN is self-powered by means of energy harvesting technology. By the one or more embodiments described above in FIGS. 1(a)-4(c), the energy is self-generated by the AWSN. The energy can be self-generated by thermo-electric generation, electro-magnetic generation, and piezo-electric generation.

The majority of IOT devices are battery powered, and battery replacement in IOT devices can be a huge maintenance job. Manpower for battery maintenance and replacement is not needed with the AWSN. The energy harvesting technology eliminates the need for large manpower and other maintenance costs associated with either replacing or maintaining the battery in IOT devices.

In summary, the AWSN can self-generate its own power from energy sources in a plurality of ways, and thereby eliminates the need for battery maintenance, and replacement. Further, the AWSN can provide the generated energy to the modules within the AWSN using thereto-electric energy harvesting, piezo-electric energy harvesting and electro-magnetic energy harvesting. Unforeseen pitfalls are avoided by reducing a low-energy state to an open-circuit state. Further, power is optimized and energy savings are enhanced through the AWSN using star topology, event-chaining topology, energy function supervision and a synchronous duty cycle. In addition, based on the energy generated by the methods described above, energy management is provided to the modules and sub-modules within the AWSN.

CONCLUSION

All references, including granted patents and patent application publications, referred herein are incorporated herein by reference in their entirety.

All the features disclosed in this specification, including any accompanying abstract and drawings, may be replaced by alternative features serving the same, equivalent or similar purpose, unless expressly stated otherwise. Thus, unless expressly stated otherwise, each feature disclosed is one example only of a generic series of equivalent or similar features.

Various aspects of the invention have been described above by way of illustration, and the specific embodiments disclosed are not intended to limit the invention to the particular forms disclosed. The particular implementation of the system provided thereof may vary depending upon the particular context or application. The invention is thus to cover all modifications, equivalents, and alternatives falling within the spirit and scope of the following claims. It is to be further understood that not all of the disclosed embodiments in the foregoing specification will necessarily satisfy or achieve each of the objects, advantages, or improvements described in the foregoing specification.

The corresponding structures, materials, acts, and equivalents of all means or step plus function elements in the claims below are intended to include any structure, material, or act for performing the function in combination with other claimed elements as specifically claimed.

The invention claimed is:

1. A method comprising:
    configuring a first levitation magnet at a first position;
    positioning a suspension magnet underneath the levitation magnet at a second position, wherein the suspension magnet is configured underneath the first levitation magnet, and configured to oscillate continuously with a specific displacement in relation to acceleration levels and frequency of vibration, wherein magnetic flux is configured to cut across electrical coil windings positioned above or below the suspension magnet, wherein energy is generated as a result of the magnetic flux that cuts across the electrical coil windings for powering one or more modules; and
    positioning a second levitation magnet underneath the suspension magnet and first levitation magnet, wherein the suspension magnet is configured to levitate between the first levitation magnet and the second levitation magnet.

2. The method of claim 1, further comprising:
    positioning one or more relief air vents to minimize friction from the suspension magnet while the suspension magnet is oscillating.

3. The method of claim 1, further comprising:
    configuring a vibration frequency tuning screw to adjust a desired power at various vibration frequencies.

4. A method comprising:
    positioning a cold plate at a first position;
    configuring heat to flow through a mounting metal bracket to a hot plate and then to the cold plate and a heat sink to enable a thermal gradient to be established, wherein a module transducer converts the established thermal gradient to electrical energy;
    and
    positioning at least one module at a second position to receive the generated electrical energy.

5. The method of claim 4, further comprising:
    positioning the hot plate directly underneath a thermo-electric generator.

6. The method of claim 4, wherein the thermal gradient is a positive temperature gradient.

7. The method of claim 4, wherein the generated electrical energy is coupled to an electronics circuit to harvest and power one or more sensors.

8. A method comprising:
    configuring a piezo-electric beam in a direction of a roller beam support assembly;
    positioning a first roller above the roller beam support assembly and a second roller below the roller beam support assembly, wherein the first roller and the second roller are moved toward the piezo-electric beam to increase a frequency of vibration and to optimize an energy generation; and
    configuring a roller hinge with a rack and pinion gear arrangement to move the first roller and the second roller back and forth.

9. The method of claim 8, wherein the rack and pinion gear arrangement move the first roller and the second roller back and forth to tune the piezo-electric beam for resonance frequency.

10. The method of claim 8, further comprising:
    rotating the rack and pinion gear arrangement clockwise to generate the energy.

11. The method of claim 8, further comprising:
    rotating the rack and pinion gear arrangement counter-clockwise to generate the energy.

12. The method of claim 1, further comprising:
    positioning one or more sub-modules to provide a forecasting function based on the received generated energy, wherein the forecasting function is based on energy state computation and power profile management, wherein the forecasting function includes loading sub-module's storage energy consumption behavior prediction and consumption behavior characterization; and
    configuring one or more sensors that enable a subsystem activation decision and subsystem power requirement profile based on the forecasting function.

13. The method of claim 12, further comprising:
    activating a periodic type of task cost function computation.

14. The method of claim 12, further comprising:
    activating an episodic type of task cost function computation.

15. The method of claim 12, further comprising:
    loading subsystem electrical fault identification that correlates with an energy consumption profile.

16. The method of claim 4, further comprising:
    positioning one or more sub-modules to provide a forecasting function based on the received generated energy, wherein the forecasting function is based on energy state computation and power profile management, wherein the forecasting function includes loading sub-module's storage energy consumption behavior prediction and consumption behavior characterization; and configuring one or more sensors that enable a subsystem activation decision and subsystem power requirement profile based on the forecasting function.

17. The method of claim 8, further comprising:

positioning one or more sub-modules to provide a forecasting function based on the received generated energy, wherein the forecasting function is based on energy state computation and power profile management, wherein the forecasting function includes loading sub-module's storage energy consumption behavior prediction and consumption behavior characterization; and configuring one or more sensors that enable a subsystem activation decision and subsystem power requirement profile based on the forecasting function.

18. The method of claim 17, wherein the energy state computation and power profile management is determined based on the generated energy.

19. The method of claim 17, wherein performance customization of the one or more sensors is adapted through energy requirements.

20. The method of claim 1, wherein energy state computation and power file management is determined based on the generated energy.

* * * * *